(12) United States Patent
Sueyoshi

(10) Patent No.: US 7,595,545 B2
(45) Date of Patent: Sep. 29, 2009

(54) ANODIC BONDING APPARATUS, ANODIC BONDING METHOD, AND METHOD OF PRODUCING ACCELERATION SENSOR

(75) Inventor: Shinichi Sueyoshi, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 496 days.

(21) Appl. No.: 11/375,053

(22) Filed: Mar. 15, 2006

(65) Prior Publication Data

US 2006/0228824 A1 Oct. 12, 2006

(30) Foreign Application Priority Data

Apr. 8, 2005 (JP) ............... 2005-112307

(51) Int. Cl.
*H01L 23/58* (2006.01)
(52) U.S. Cl. .............. 257/634; 438/455; 438/456; 257/E21.512; 257/E21.567; 156/349; 156/358
(58) Field of Classification Search ........ 257/629, 257/632, 634, 618–628, E21.512, E21.567; 438/455–459, 795; 156/358, 381, 349, 389.6, 156/379.7, 380.2, 380.6
See application file for complete search history.

(56) References Cited

U.S. PATENT DOCUMENTS 5,478,782 A * 12/1995 Satoh et al. .............. 438/455

| 6,082,140 | A | * | 7/2000 | Ackler et al. | ............... 65/36 |
| 6,168,963 | B1 | * | 1/2001 | Freund et al. | ............. 438/26 |
| 6,537,938 | B1 | * | 3/2003 | Miyazaki | ................ 501/66 |
| 7,180,179 | B2 | * | 2/2007 | Mok et al. | ............... 257/714 |
| 7,358,740 | B2 | * | 4/2008 | Davis et al. | ............. 324/417 |
| 2007/0111471 | A1 | * | 5/2007 | Okada | .................. 438/455 |

FOREIGN PATENT DOCUMENTS

| JP | 07-183181 | 7/1995 |
| JP | 09-246127 | 9/1997 |

* cited by examiner

*Primary Examiner*—W. David Coleman
*Assistant Examiner*—Su C Kim
(74) *Attorney, Agent, or Firm*—Kubotera & Associates, LLC

(57) ABSTRACT

An anodic bonding apparatus includes a first electrode and a second electrode. The first electrode has a first surface, and the second electrode has a second surface facing the first surface. The first surface includes a first central area; a first substrate placing area for placing a laminated substrate; and a first peripheral area surrounding the first substrate placing area. The second surface includes a second central area corresponding to the first central area; a second substrate placing area surrounding the second central area; and a second peripheral area corresponding to the first peripheral area and surrounding the second substrate placing area. Further, the second electrode includes a curved portion curved toward the first electrode, so that a distance between the first central area and the second central area becomes smaller than a distance between the first peripheral area and the second peripheral area.

5 Claims, 7 Drawing Sheets

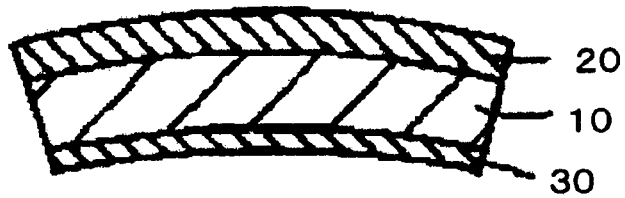
FIG. 7 (a) PRIOR ART
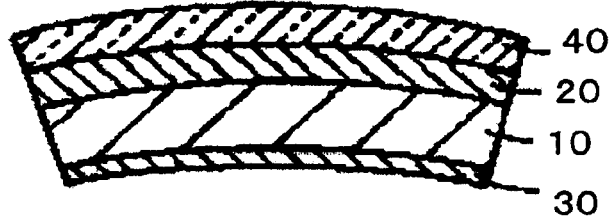
FIG. 7 (b) PRIOR ART
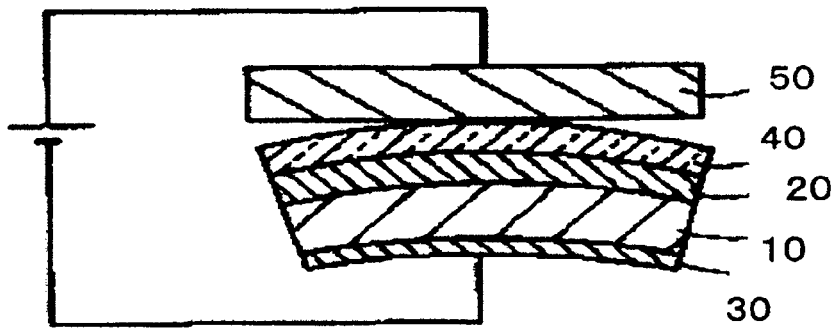
FIG. 7 (c) PRIOR ART
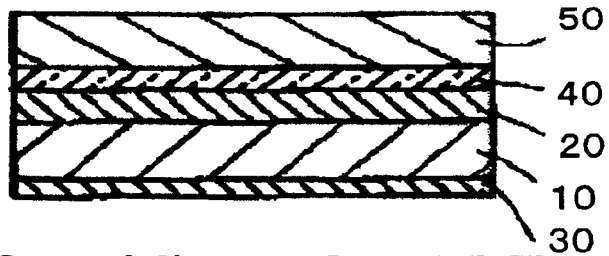
FIG. 7 (d) PRIOR ART

ANODIC BONDING APPARATUS, ANODIC BONDING METHOD, AND METHOD OF PRODUCING ACCELERATION SENSOR

BACKGROUND OF THE INVENTION AND RELATED ART STATEMENT

The present invention relates to an anodic bonding apparatus for bonding a plurality of substrates arranged between two electrodes facing each other. The present invention also relates to an anodic bonding method and a method of producing an acceleration sensor.

An anodic bonding has been used for bonding, for example, a semiconductor substrate and a glass substrate. The anodic bonding has also been used for bonding silicon substrates with a glass layer in between to produce a silicon structure having a micromachining sensor using Micro Electrical Mechanical System (MEMS) technology. A conventional anodic bonding apparatus has a pair of electrodes having two electrodes plates facing each other, and two substrates to be bonded are placed horizontally between the electrodes. In bonding, one of the electrodes becomes an anode and the other of the electrodes becomes a cathode, so that a voltage is applied to the two substrates. The two substrates closely contact with each other, and portions contacting with each other are bonded through the anodic bonding.

The anodic bonding will be explained next in more detail. When a silicon substrate and a glass substrate are bonded, for example, an electrode on a side of the silicon substrate becomes a cathode and an electrode on a side of the glass substrate becomes an anode. When a voltage is applied to the electrodes, the silicon substrate is charged with positive charges. In the glass substrate, sodium ions are attracted toward the electrode, so that a side of the glass substrate facing the silicon substrate is charged with negative charges. Accordingly, a large static attractive force is generated between bonding surfaces of the silicon substrate and the glass substrate due to the positive charges and the negative charges, thereby bonding the silicon substrate and the glass substrate together.

There is a case that a substrate to be bonded is not completely flat and may have a concave or convex portion. In this case, bonding surfaces of such substrates do not closely contact with each other. Accordingly, an undesirable space may be formed between the bonding surfaces upon bonding, thereby causing an un-bonded portion.

Patent reference 1 has disclosed an anodic bonding apparatus to solve the problem described above. In the anodic bonding apparatus, a silicon substrate is mechanically curved in a convex shape toward a bonding surface thereof, and the silicon substrate is bonded to a glass substrate in this state. FIG. 6 is a view showing the anodic bonding apparatus disclosed in Patent Reference 1. As shown in FIG. 6, a silicon substrate 20 is arranged to face a glass substrate 10, and a slider 30 pushes upwardly an outer periphery of the silicon substrate 20 at four positions. An upper electrode pushes a center portion of the silicon electrode 20 downwardly, so that the silicon substrate 20 is curved in a convex shape toward a bonding surface thereof. Then, the slider 30 gradually moves outwardly, so that the silicon electrode 20 is bonded to the glass substrate 10 from the center portion toward the outer periphery thereof while releasing the curved state.

Patent Reference 2 has disclosed another bonding technology. In the technology disclosed in Patent Reference 2, after a thin layer is formed on a silicon substrate so that the silicon substrate is curved, the silicon substrate is bonded to a glass substrate with the anodic bonding. FIGS. 7(a) to 7(d) are views showing a process of the anodic bonding disclosed in Patent Reference 2.

As shown in FIGS. 7(a) to 7(d), first, a first oxide layer 20 is formed on a bonding surface of a first silicon substrate 10. Then, a second oxide layer 30 having a thickness larger than that of the second oxide substrate 30 is formed on a surface of the first silicon substrate 10 opposite to the bonding surface thereof. Due to the difference in a thickness between the first oxide substrate 10 and the second oxide substrate 30, the first silicon substrate 10 is curved as shown in FIG. 7(a). In this state, the first silicon substrate 10 is bonded to a glass substrate 40. As a result, the glass substrate 40 is curved as shown in FIG. 7(b). Then, the glass substrate 40 in a convex shape toward a bonding surface thereof is bonded to a silicon substrate 50 as shown in FIGS. 7(c) and 7(d).

Patent Reference 1: Japanese Patent Publication No. 07-183181
Patent Reference 2: Japanese Patent Publication No. 09-246127

In the conventional anodic bonding apparatus disclosed in Patent Reference 1, the slider and the upper electrode are provided around the substrates for applying a mechanical stress to the substrates. Accordingly, it is possible that the substrates may be cracked or tipped at the periphery or the center portion thereof. Further, charges move toward the center portion of the substrate, thereby reducing bonding strength at the periphery thereof.

In Patent References 1 and 2, the substrate to be bonded is curved, that is, the substrate curved in a concave shape toward the bonding surface thereof is curved in a convex shape toward the bonding surface thereof by applying an external force. Accordingly, a surface area of the substrate where an element is formed is changed to a relatively large extent, and an excessive stress is generated in the substrate. Especially, when a semiconductor substrate has a small thickness, such a substrate may be damaged due to the excessive stress.

When a substrate includes an element for measuring an external stress such as a silicon structure formed with the MEMS technology, i.e., an acceleration sensor, such a substrate is susceptible to an excessive change in a shape thereof. Accordingly, when such a substrate is bonded, the element itself may be damaged.

In view of the problems described above, an object of the present invention is to provide an anodic bonding apparatus capable of solving the problems described above. Further, an object of the present invention is to provide an anodic bonding method and a method of producing an acceleration sensor.

Further objects and advantages of the invention will be apparent from the following description of the invention.

SUMMARY OF THE INVENTION

In order to attain the objects described above, according to the present invention, an anodic bonding apparatus includes a first electrode and a second electrode. The first electrode has a first surface, and the second electrode has a second surface facing the first surface. The first surface includes a first central area; a first substrate placing area for placing a laminated substrate and containing the first central area; and a first peripheral area surrounding the first substrate placing area. The second surface includes a second central area corresponding to the first central area; a second substrate placing area corresponding to the first substrate placing area and surrounding the second central area; and a second peripheral area corresponding to the first peripheral area and surrounding the second substrate placing area. Further, the second electrode includes a curved portion curved toward the first electrode, so that a distance between the first central area and the second central area becomes smaller than a distance between the first peripheral area and the second peripheral area.

According to the present invention, an anodic bonding method includes a step of preparing an anodic bonding apparatus having a first electrode and a second electrode. The first electrode has a first surface, and the second electrode has a second surface facing the first surface. The first surface includes a first central area; a first substrate placing area for placing a laminated substrate and containing the first central area; and a first peripheral area surrounding the first substrate placing area. The second surface includes a second central area corresponding to the first central area; a second substrate placing area corresponding to the first substrate placing area and surrounding the second central area; and a second peripheral area corresponding to the first peripheral area and surrounding the second substrate placing area. Further, the second electrode includes a curved portion curved toward the first electrode, so that a distance between the first central area and the second central area becomes smaller than a distance between the first peripheral area and the second peripheral area.

According to the present invention, the anodic bonding method further includes a step of placing the laminated substrate over the first central area and the first substrate placing area of the first electrode; a first contact step of contacting the second central area of the second electrode with the laminated substrate to form a contact area; a second contact step of contacting the second substrate placing area of the second electrode with the laminated substrate to enlarge the contact area to a whole area of the laminated substrate; and a bonding step of applying a voltage to the first electrode and the second electrode to bond the laminated substrate.

According to the present invention, a method of producing an acceleration sensor includes a step of preparing an anodic bonding apparatus having a first electrode and a second electrode. The first electrode has a first surface, and the second electrode has a second surface facing the first surface. The first surface includes a first central area; a first substrate placing area for placing a laminated substrate and containing the first central area; and a first peripheral area surrounding the first substrate placing area. The second surface includes a second central area corresponding to the first central area; a second substrate placing area corresponding to the first substrate placing area and surrounding the second central area; and a second peripheral area corresponding to the first peripheral area and surrounding the second substrate placing area. Further, the second electrode includes a curved portion curved toward the first electrode, so that a distance between the first central area and the second central area becomes smaller than a distance between the first peripheral area and the second peripheral area.

According to the present invention, the laminated substrate is formed of an acceleration sensor substrate having an acceleration sensor and a glass substrate contacting with the acceleration sensor substrate. The method of producing an acceleration sensor further includes a step of placing the laminated substrate over the first central area and the first substrate placing area of the first electrode; a first contact step of contacting the second central area of the second electrode with the laminated substrate to form a contact area; a second contact step of contacting the second substrate placing area of the second electrode with the laminated substrate to enlarge the contact area to a whole area of the laminated substrate; and a bonding step of applying a voltage to the first electrode and the second electrode to bond the acceleration sensor substrate and the glass substrate.

In the present invention, it is possible to closely contact and bond two substrates together without applying an excessive stress to the substrates.

BRIEF DESCRIPTION OF THE DRAWINGS

FIGS. 7(a) to 7(d) are schematic sectional views showing conventional anodic bonding technology.

DETAILED DESCRIPTION OF PREFERRED EMBODIMENTS

Hereunder, embodiments of the present invention will be explained with reference to the accompanying drawings. In the embodiments, a conventional known material such as a glass substrate may be used, and an explanation thereof may be omitted.

Figure 1:
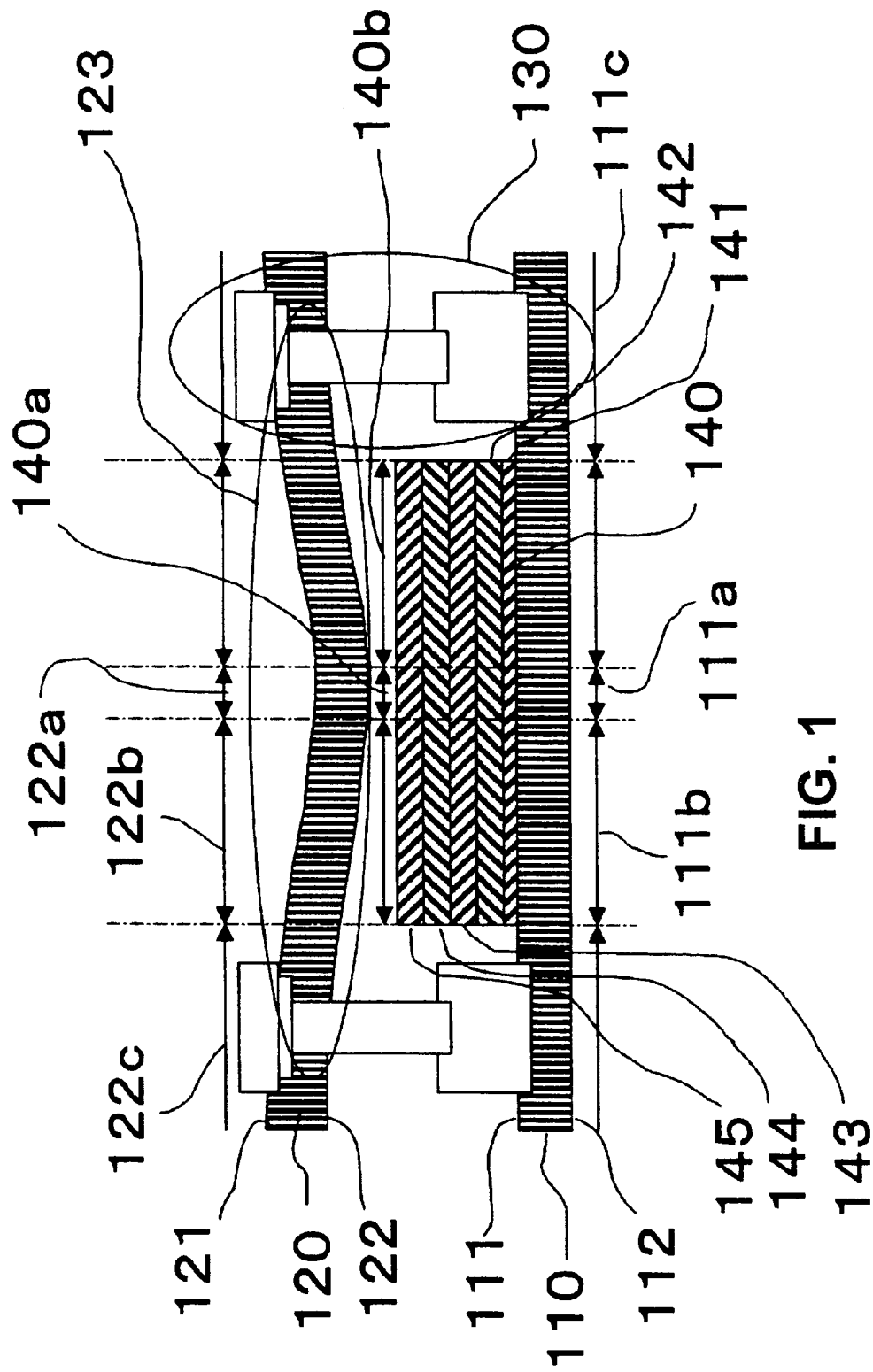
FIG. 1 is a schematic sectional view showing an anodic bonding apparatus according to an embodiment of the present invention.
Figure 2:
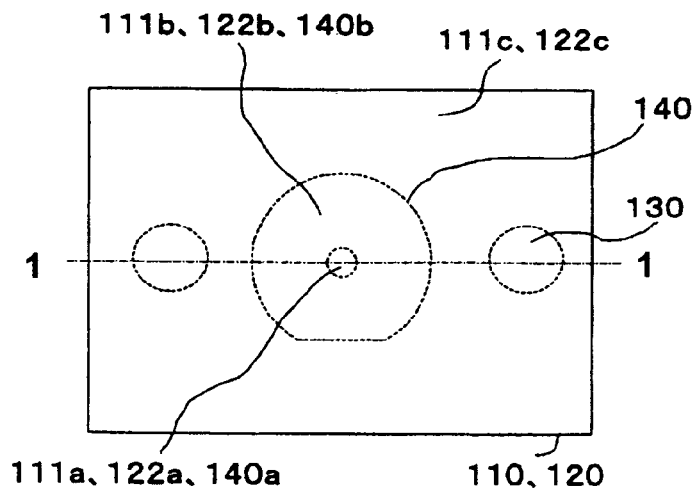
FIGS. 2(a) to 2(c) are schematic plan views of the anodic bonding apparatus according to the embodiment of the present invention.
Figure 2:
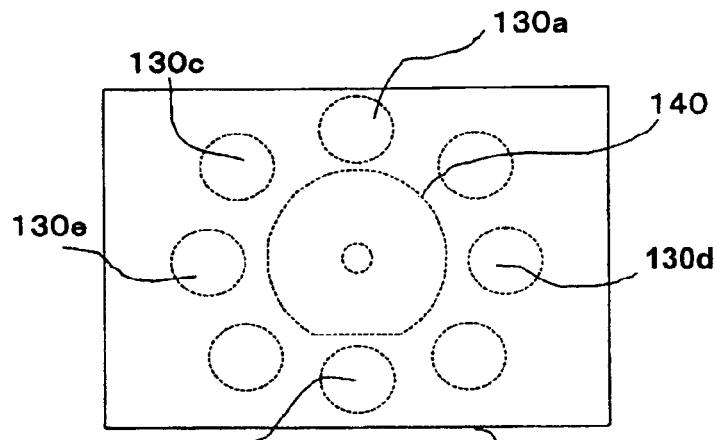
Figure 2:
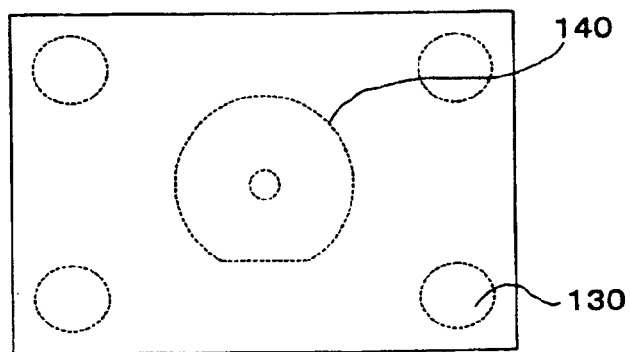

An anodic bonding apparatus according to an embodiment of the present invention will be explained with reference to FIG. 1 and FIGS. 2(a) to 2(c). FIG. 1 is a schematic sectional view showing the anodic bonding apparatus taken along a line 1-1 in FIG. 2(a). FIGS. 2(a) to 2(c) are schematic plan views of the anodic bonding apparatus according to the embodiment of the present invention.

As shown in FIG. 1, the anodic bonding apparatus includes a first electrode 110; a second electrode 120; and fixing members 130.

The first electrode 110 is formed of an electrode plate in a rectangular shape having a first upper surface 111 and a first lower surface 112 opposite to the first upper surface 111. The first upper surface 111 includes a first central area 111a; a first substrate placing area 111b surrounding the first central area 111a; and a first peripheral area 111c surrounding the first substrate placing area 111b. A laminated substrate 140 (described later) is placed over the first central area 111a and the first substrate placing area 111b. At this time, the first central area 111a is situated at a position same as that of a third central area 140a of an upper surface of the laminated substrate 140 in a plan view viewed from above. A material of the first electrode 110 includes a conductive material, and in the embodiment, the first electrode 110 is formed of carbon same as that of the second electrode 120.

The second electrode 120 is formed of an electrode plate in a rectangular shape having a second lower surface 122 facing the first upper surface 111 of the first electrode 110 and a second upper surface 121 opposite to the second lower surface 122. The second lower surface 122 includes a second central area 122a; a second substrate placing area 122b surrounding the second central area 122a; and a second peripheral area 122c surrounding the second substrate placing area 122b. When the laminated substrate 140 (described later) is placed, the second central area 122a is situated at a position same as that of the first central area 111a and the third central area 140a of the laminated substrate 140 in a plan view viewed from above. Further, the second electrode 120 includes a curved portion 123 in which the second central area 122a protrudes toward the laminated substrate 140. A material of the second electrode 120 includes a conductive material capable of deforming such as a material formed of carbon as a main component. In the embodiment, the second electrode 120 is formed of an electrode plate made of carbon.

The fixing members 130 are disposed in the second peripheral area 122c of the second electrode 120. The fixing members 130 apply a stress to the second electrode 120 toward the first electrode 110, so that the laminated substrate 140 is fixed between the first electrode 110 and the second electrode 120. In the embodiment, the fixing members 130 are formed of screws. As shown in FIG. 2(a), the fixing members 130 are disposed in the second peripheral area 122c on a straight line passing through the second central area 122a in a plan view viewed from above. As shown in FIG. 2(b), a plurality of fixing members 130a to 130e may be disposed in the second peripheral area 122c around the second substrate placing area 122b. In this case, the fixing member 130b situated at an opposite side relative to the fixing member 130a with the second substrate placing area 122b in between is repeatedly tightened, that is, the fixing members 130a to 130e are tightened little by little in the order of 130a, 130b, 130c, 130d, to 130e, it is possible to closely fix the laminated substrate 140. As shown in FIG. 2(c), the fixing members 130 may be disposed at four corners of the second electrode 120. When a plurality of fixing members 130 is disposed, it is possible to apply a stress to a whole surface of the laminated substrate 140 uniformly, thereby closely contacting uniformly.

In the embodiment, the laminated substrate 140 may be formed of at least two substrates to be bonded. In the laminated substrate 140 in the embodiment, a lower semiconductor substrate 141; a bonding semiconductor substrate 142; a bonding glass substrate 143, an upper glass substrate 144; and an upper semiconductor substrate 145 are laminated in this order from a lower side. The laminated substrate 140 is placed over the first central area 111a and the first substrate placing area 111b of the first upper surface 111 of the first electrode 110. The upper surface of the laminated substrate 140 includes the third central area 140a defined such that the third central area 140a is situated at a position same as that of the first central area 111a in a plan view viewed from above; and a third peripheral area 140b surrounding the third central area 140a.

The lower semiconductor substrate 141 has an upper surface and a lower surface opposite to the upper surface. The lower surface of the lower semiconductor substrate 141 is placed over the first central area 111a and the first substrate placing area 111b of the first electrode 110 (not shown). A material of the lower semiconductor substrate 141 includes a semiconductor material capable of forming an element, and is formed of silicon in the embodiment.

The bonding semiconductor substrate 142 has an upper surface and a lower surface opposite to the upper surface. The lower surface of the bonding semiconductor substrate 142 is placed over the upper surface of the lower semiconductor substrate 141 (not shown). A semiconductor element is formed on the lower surface of the bonding semiconductor substrate 142. When the bonding semiconductor substrate 142 is formed on the lower semiconductor substrate 141, it is possible to prevent the lower surface of the bonding semiconductor substrate 142 with the semiconductor element from directly contacting with the first electrode 110. A material of the bonding semiconductor substrate 142 includes a material same as that of the lower semiconductor substrate 141, and is formed of silicon in the embodiment.

The bonding glass substrate 143 has an upper surface and a lower surface opposite to the upper surface. The lower surface of the bonding glass substrate 143 is placed over the upper surface of the bonding semiconductor substrate 142 (not shown). A material of the bonding glass substrate 143 includes an amorphous material containing silicon as a main component, and is formed of silica glass or silica boric acid glass formed of silica glass containing boric acid in the embodiment.

The upper glass substrate 144 has an upper surface and a lower surface opposite to the upper surface. The lower surface of the upper glass substrate 144 is placed over the upper surface of the bonding glass substrate 143 (not shown). The upper glass substrate 144 is formed of a material same as that of the bonding glass substrate 143, and is formed of silica glass or silica boric acid glass formed of silica glass containing boric acid in the embodiment.

The upper semiconductor substrate 145 has an upper surface and a lower surface opposite to the upper surface. The lower surface of the upper semiconductor substrate 145 is placed over the upper surface of the upper glass substrate 144 (not shown). A material of the upper semiconductor substrate 145 includes a semiconductor material, and is formed of silicon in the embodiment. The lower surface of the upper semiconductor substrate 145 is bonded to the upper surface of the upper glass substrate 144 in advance with anodic bonding and the like. When the upper glass substrate 144 and the upper semiconductor substrate 145 bonded to the upper glass substrate 144 are placed on the bonding glass substrate 143, the bonding glass substrate 143 does not directly contact with the second electrode 120. Accordingly, when a voltage is applied for bonding, it is possible to prevent the second electrode 120 from being contaminated due to sodium ions moving from the bonding glass substrate 143 toward the second electrode 120.

In the anodic bonding apparatus according to the embodiment, the second electrode 120 is provided with the curved portion 123. Accordingly, even when one or both of the bonding semiconductor substrate 142 and the bonding glass substrate 143 are curved in a concave shape toward the bonding surfaces of the bonding semiconductor substrate 142 and the bonding glass substrate 143, the curved portion 123 contacts with the third central area 140a of the laminated substrate 140 when the bonding semiconductor substrate 142 is bonded to the bonding glass substrate 143. As a result, the third central area 140a contacts first, and then the third peripheral area 140b contacts through deformation of the second electrode 120, so that the bonding semiconductor substrate 142 is completely bonded to the bonding glass substrate 143, that is, the bonding surface extends from the center to the periphery. Therefore, even if a undesirable space is generated between the bonding surfaces, it is possible to eliminate the space from the center to the periphery, thereby making it possible to bond the substrates closely.

Further, it is not necessary to curve the substrate to be bonded in a convex shape toward the bonding surface. Accordingly, it is possible to bond the substrate without applying an excessive stress to the substrate. It is also arranged such that the first electrode 110 and the second electrode 120 cover the laminated substrate 140 completely. Accordingly, when a voltage is applied, it is possible to apply the voltage to the third central area 140a and the third peripheral area 140b of the laminated substrate 140 uniformly, thereby eliminating a local spot with a low bonding strength.

Figure 3:
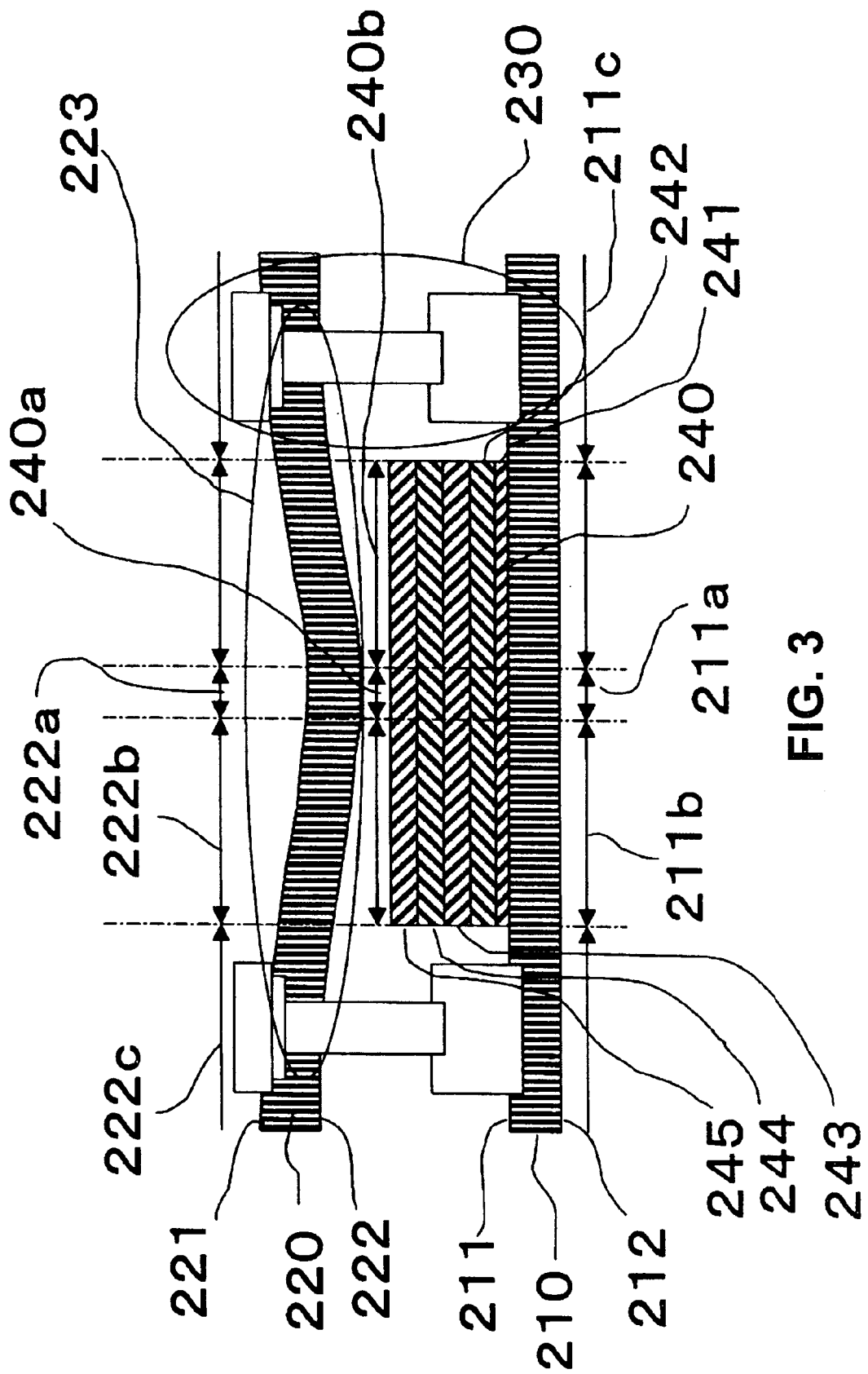
FIG. 3 is a schematic sectional view for explaining an anodic bonding method according to the embodiment of the present invention.
Figure 4:
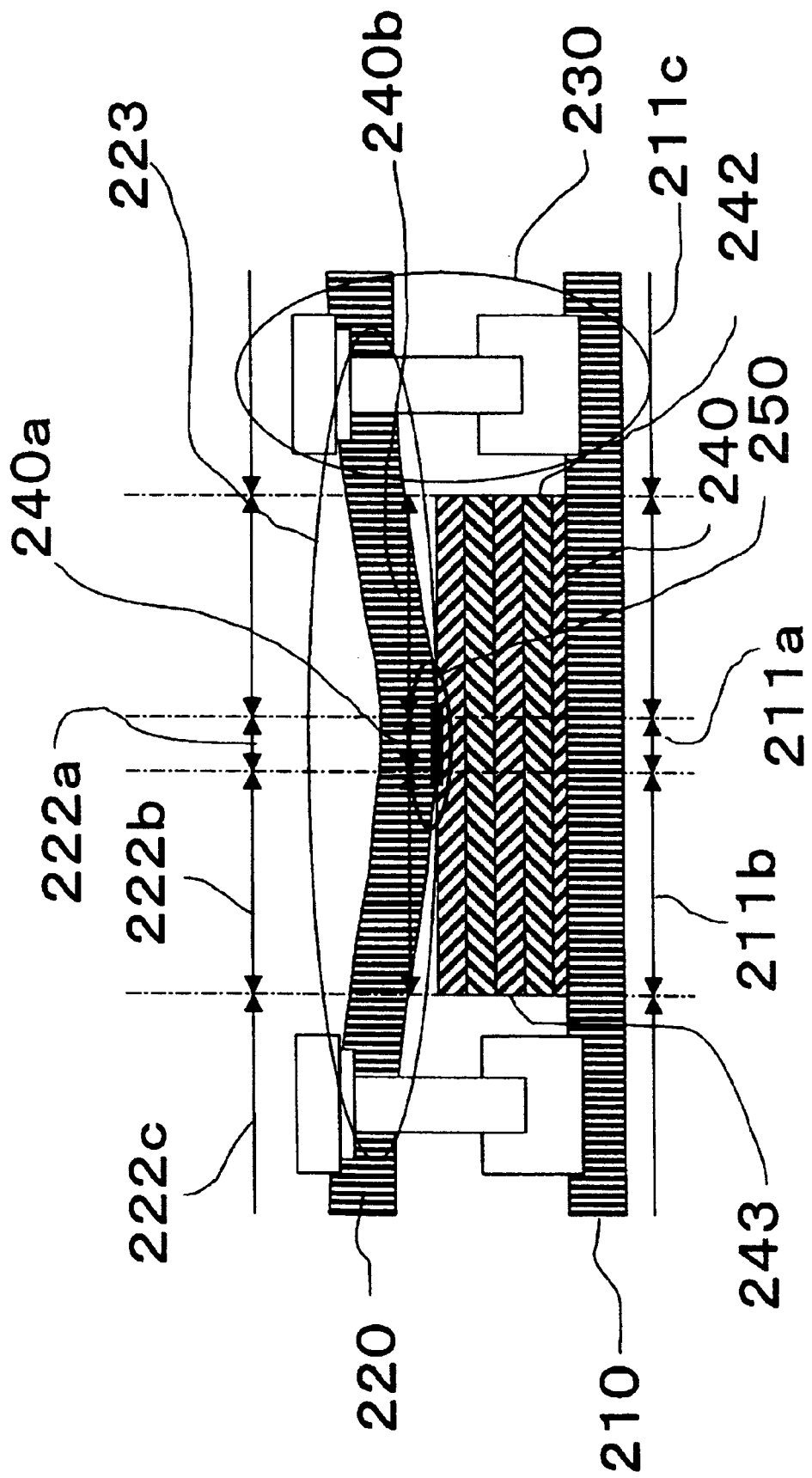
FIG. 4 is a schematic sectional view for explaining the anodic bonding method according to the embodiment of the present invention.
Figure 5:
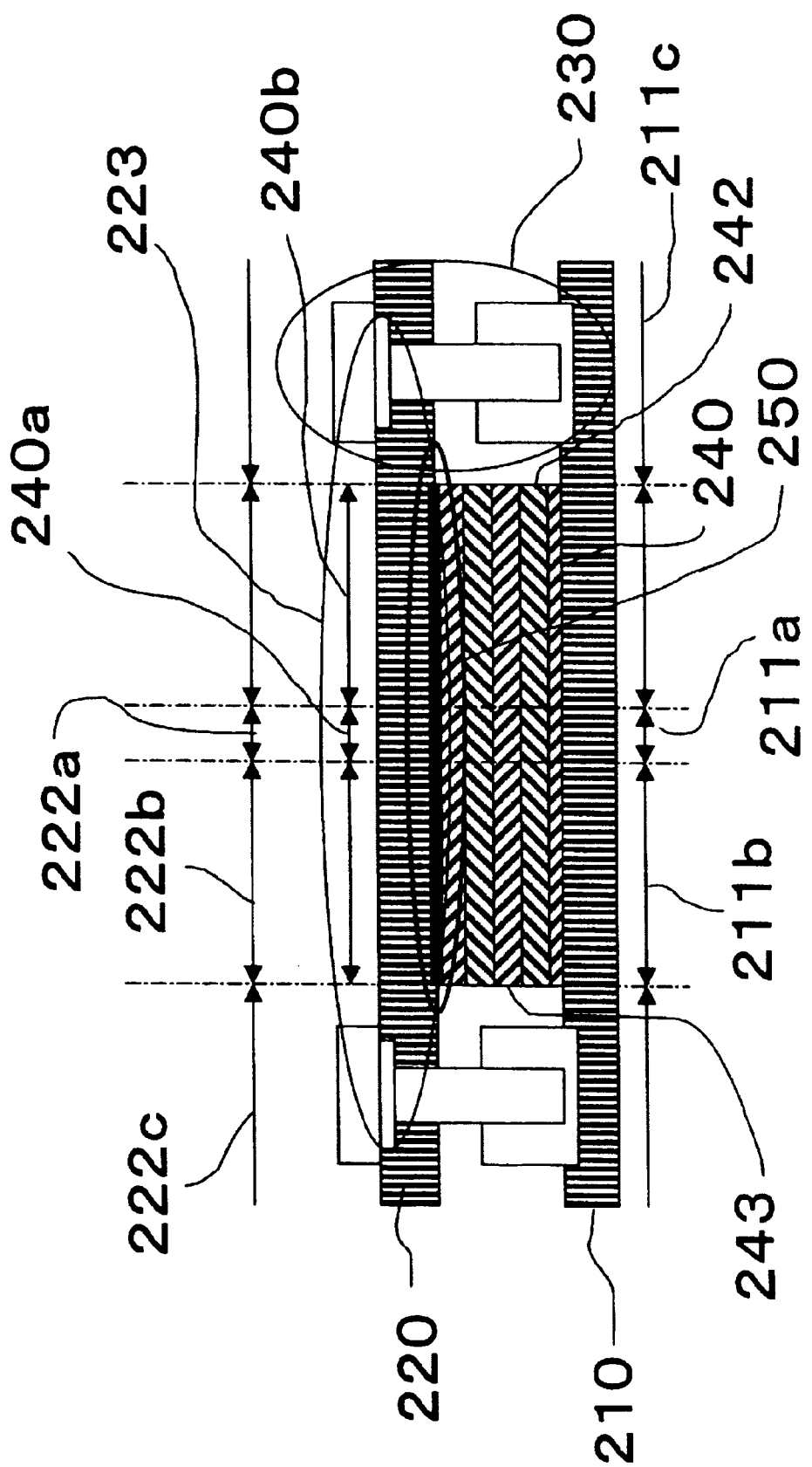
FIG. 5 is a schematic sectional view for explaining the anodic bonding method according to the embodiment of the present invention.
Figure 6:
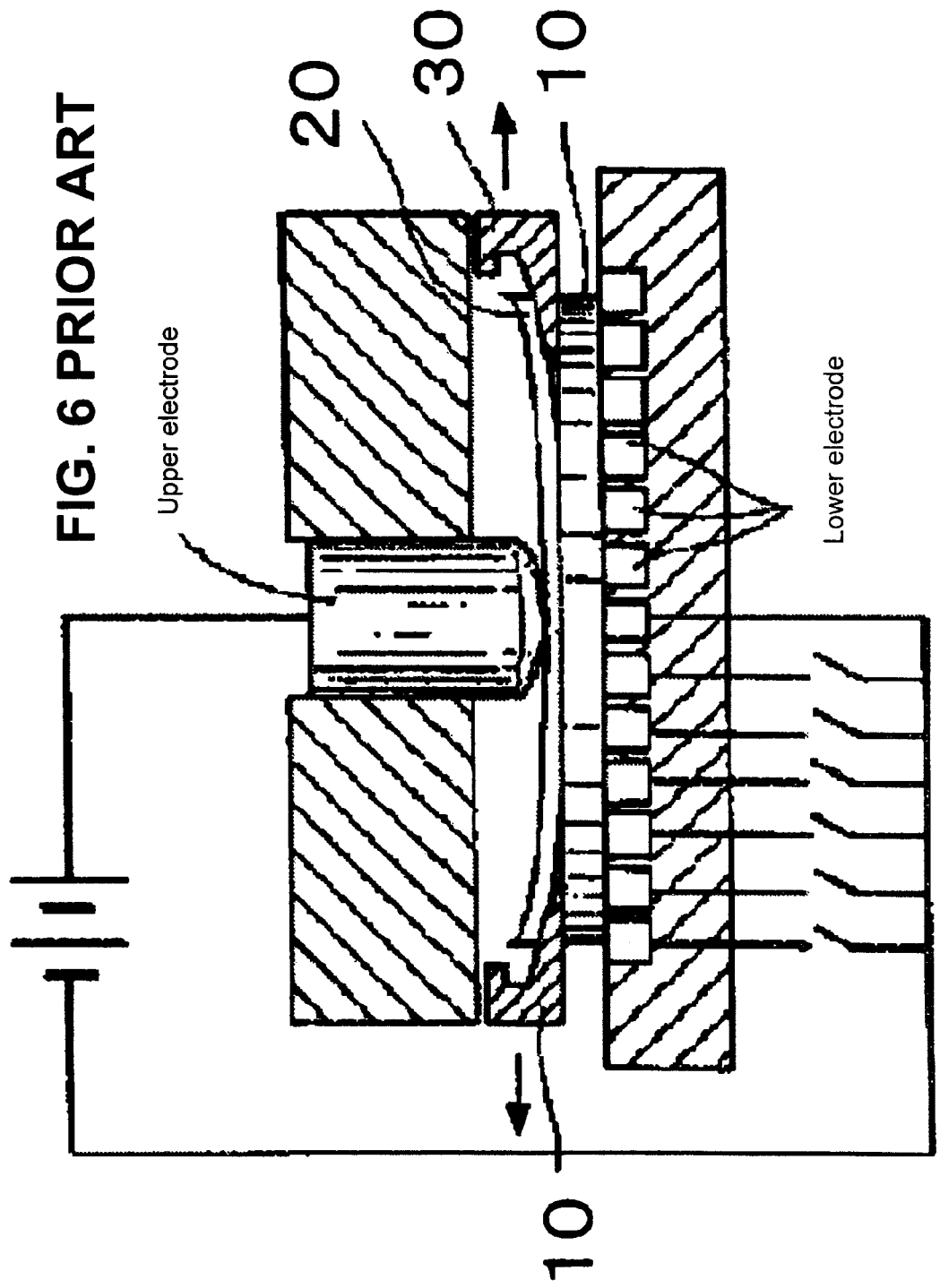
FIG. 6 is a schematic sectional view showing a conventional anodic bonding apparatus.

An anodic bonding method will be explained next with reference to FIGS. 3 to 5. FIG. 3 is a schematic sectional view for explaining the anodic bonding method according to the embodiment of the present invention. FIG. 4 is a schematic sectional view for explaining the anodic bonding method according to the embodiment of the present invention. FIG. 5 is a schematic sectional view for explaining the anodic bonding method according to the embodiment of the present invention.

As shown in FIG. 3, in an anodic bonding apparatus, a laminated substrate 240 is placed on a second electrode 220 facing a first electrode 210. The first electrode 210 has a first upper surface 211 and a first lower surface 212 opposite to the first upper surface 211. The first upper surface 211 includes a first central area 211a; a first substrate placing area 211b; and a first peripheral area 211c. The second electrode 220 has a second upper surface 221 and a second lower surface 222 opposite to the second upper surface 221. The second lower surface 222 includes a second central area 222a; a second substrate placing area 222b; and a second peripheral area 222c. Further, the second electrode 220 includes a curved portion 223.

In the embodiment, the laminated substrate 240 may be formed of at least two substrates to be bonded. In the laminated substrate 240 in the embodiment, a lower semiconductor substrate 241; a bonding semiconductor substrate 242; a bonding glass substrate 243, an upper glass substrate 244; and an upper semiconductor substrate 245 are laminated in this order from a lower side. The laminated substrate 240 is placed over the first central area 211a and the first substrate placing area 211b of the first electrode 210. An upper surface of the laminated substrate 240 includes a third central area 240a and a third peripheral area 240b. Fixing members 230 are disposed in the second peripheral area 222c of the second electrode 220. Materials and shapes of the first electrode 210, the second electrode 220, the fixing members 230, and the laminated substrate 240 are the same as those of the anodic bonding apparatus explained above, and explanations thereof are omitted.

The laminated substrate 240 is placed over the first central area 211a and the first substrate placing area 211b of the first electrode 210, such that the third central area 240a of the laminated substrate 240 is situated at a position same as that of the first central area 211a of the first electrode 210 and the second central area 222a of the second electrode 220 in a plan view viewed from above. Further, it is arranged such that the third peripheral area 240b of the laminated substrate 240 is situated at a position same as that of the first substrate placing area 211b of the first electrode 210 and the second substrate placing area 222b of the second electrode 220 in a plan view viewed from above.

As shown in FIG. 4, the laminated substrate 240 is placed over the first central area 211a and the first substrate placing area 211b of the first electrode 210, so that the third central area 240a of the upper surface of the laminated substrate 240 contacts with the curved portion 223 of the second electrode 220 to form a contacting surface 250. Then, the fixing members 230 are tightened to reduce a distance between the first electrode 210 and the second electrode 220, thereby closely contacting the second electrode 220 with the laminated substrate 240.

As shown in FIG. 5, when the fixing members 230 are further tightened, the second electrode 220 further pushes the laminated substrate 240, so that the contacting surface 250 extends from the central area to the peripheral area of the upper surface of the laminated substrate 240. At this time, the fixing members 230 push the second electrode 220 to deform such that the curved portion 223 becomes flat. After the first electrode 210 and the second electrode 220 closely contact with the laminated substrate 240, a voltage is applied to the first electrode 210 and the second electrode 220, thereby bonding the bonding semiconductor substrate 242 and the bonding glass substrate 243 through the anodic bonding.

In the embodiment, a voltage of 450 to 550 V is applied for two to three minutes for the anodic bonding. These conditions may be adjusted according to conditions such as the materials and thicknesses of the bonding semiconductor substrate 242 and the bonding glass substrate 243. Further, when the anodic bonding is conducted in vacuum, it is possible to eliminate a undesirable space at the bonding surface. Alternatively, when the anodic bonding is conducted under atmospheric pressure, it is possible to reduce deformation of the laminated substrate 240. These conditions may be adjusted according to an application.

In the anodic bonding method according to the embodiment, the second electrode 220 is provided with the curved portion 223. Accordingly, even when one or both of the bonding semiconductor substrate 242 and the bonding glass substrate 243 are curved in a concave shape toward the bonding surface of the bonding semiconductor substrate 242 and the bonding glass substrate 243, the curved portion 223 contacts first with the third central area 240a of the laminated substrate 240 to form the contacting surface when the second electrode 220 closely contacts with the laminated substrate 240. Then, the second electrode 220 closely contacts with the laminated substrate 240 such that the contacting surface extends over the whole upper surface of the laminated substrate 240, thereby bonding the bonding semiconductor substrate 242 and the bonding glass substrate 243 completely. Therefore, even if a space is advertently generated in the bonding surface, it is possible to eliminate the space from the center to the periphery, thereby making it possible to bond the substrates closely.

Further, it is not necessary to curve one or both of the bonding semiconductor substrate 242 and the bonding glass substrate 243 in a convex shape toward the bonding surface. Accordingly, it is possible to bond the bonding semiconductor substrate 242 and the bonding glass substrate 243 without applying an excessive stress thereto. It is possible to tighten the fixing members 230 such that there is enough time for an advertent space in the bonding surface escapes from the central area to the peripheral area, thereby making it possible to eliminate an advertent space in the bonding surface of the bonding semiconductor substrate 242 and the bonding glass substrate 243, thereby making it possible to bond the substrates completely.

In the anodic bonding apparatus and the anodic bonding method according to the embodiment, the semiconductor substrate to be bonded may include a substrate with an MEMS structure such as an acceleration sensor formed thereon. An acceleration sensor may include a base portion, a weight portion, and a beam portion for elastically connecting the base portion and the weight. In the acceleration sensor, the weight moves and deforms according to acceleration for measuring the acceleration. Accordingly, the acceleration sensor is susceptible to a strain caused by a stress during a manufacturing process. When an acceleration sensor substrate having such an acceleration sensor is bonded through the anodic bonding method of the embodiment, it is possible to eliminate an excessive stress to the acceleration sensor substrate having such an acceleration sensor. That is, when an acceleration sensor is manufactured using the anodic bonding method according to the embodiment of the present invention, it is not necessary to apply an excessive stress to an acceleration sensor substrate, thereby making it possible to prevent strain in the base portion and the beam portion, or damage on the beam portion.

The disclosure of Japanese Patent Application No. 2005-112307, filed on Apr. 8, 2005, is incorporated in the application.

While the invention has been explained with reference to the specific embodiments of the invention, the explanation is illustrative and the invention is limited only by the appended claims.

What is claimed is:

1. An anodic bonding apparatus for bonding a laminated substrate, comprising:
    a first electrode having a first surface, said first surface including a first central area; a first substrate placing area for placing the laminated substrate and containing the first central area; and a first peripheral area surrounding the first substrate placing area; and
    a second electrode having a second surface facing the first surface, said second surface including a second central area corresponding to the first central area; a second substrate placing area corresponding to the first substrate placing area and surrounding the second central area; and a second peripheral area corresponding to the first peripheral area and surrounding the second substrate placing area, said second electrode further including a curved portion curved toward the first electrode so that a distance between the first central area and the second central area becomes smaller than a distance between the first peripheral area and the second peripheral area, said second electrode being formed of a material containing carbon as a main component.

2. The anodic bonding apparatus according to claim 1, further comprising a fixing member disposed in the second peripheral area for applying a stress to the laminated substrate placed over the first central area and the first substrate placing area to fix the laminated substrate.

3. The anodic bonding apparatus according to claim 2, wherein said fixing member includes a plurality of fixing units arranged in the second peripheral area along the second substrate placing area.

4. The anodic bonding apparatus according to claim 3, wherein said second electrode has a square shape, said fixing units being arranged at corners of the square shape.

5. The anodic bonding apparatus according to claim 3, wherein said fixing units are arranged over the first peripheral area and the second peripheral area.

* * * * *